PRECISION OSCILLATOR

Filed May 21, 1959 2 Sheets-Sheet 1

INVENTOR.
JOHN W. GRAY
RICHARD SAYLOR

BY

ATTORNEY

June 7, 1960 J. W. GRAY ET AL 2,940,053

PRECISION OSCILLATOR

Filed May 21, 1959 2 Sheets-Sheet 2

INVENTOR.
JOHN W. GRAY
RICHARD SAYLOR

BY H. L. Mackey

ATTORNEY

United States Patent Office 2,940,053

Patented June 7, 1960

2,940,053

PRECISION OSCILLATOR

John W. Gray, Pleasantville, and Richard Saylor, Mount Vernon, N.Y., assignors to General Precision, Inc., a corporation of Delaware Filed May 21, 1959, Ser. No. 814,765

7 Claims. (Cl. 331—55)

This invention relates to relaxation oscillators and more particularly to such oscillators having an output of rectangular form and with frequency precisely and linearly related to a selected input parameter.

The simple and widely used free-running multivibrator relaxation oscillator may be made to emit a rectangular waveform but is not capable of extreme constancy of frequency. The frequency of its output varies with the voltages of its power supplies, with temperature and with aging of components. Since the multivibrator employs the cutoff characteristics of an electronic tube in the cycle of its operation, output is no more precise than the characteristics of the tubes it employs. These characteristics vary widely in many respects and for many reasons.

The present invention employs a plurality of electronic tubes with regenerative intercoupling but otherwise differs from the usual multivibrator. The oscillator of the invention does not depend on tube characteristics to begin and terminate each cycle of oscillation, but employs silicon semiconductor junction diodes for both of these functions. Since such diodes are highly stable and dependable, their use constitutes a marked improvement over the use of tubes whose characteristics vary considerably. The circuit is so arranged that all diodes and other components in any way affecting the frequency of operation can be conveniently positioned together and placed in a small constant-temperature oven. Thus stringent operating requirements, such as that of a frequency error not greater than 0.1% over an ambient temperature range of −55° C. to +70° C., can be met. Special circuit balance arrangements completely neutralize the effects of any supply voltage variations on frequency.

One purpose of this invention is to provide an adjustable oscillator emitting a rectangular waveform at an accurately maintained frequency.

Another purpose is to provide an oscillator which is linearly adjustable in frequency.

A further understanding of this invention may be secured from the detailed description and associated drawings, in which.

Figure 1:
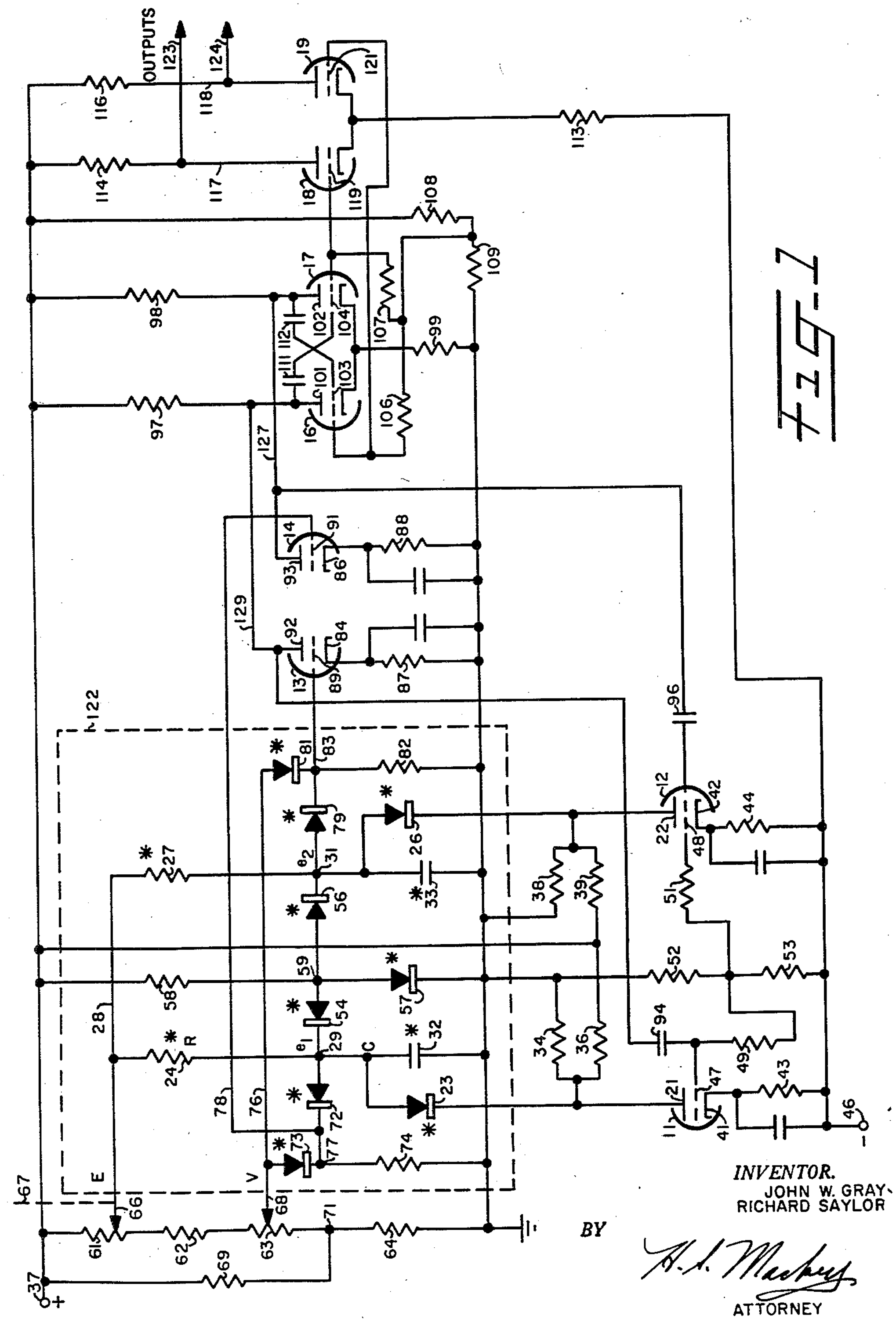
Figure 1 is a schematic diagram of an embodiment of the invention.

Referring now to Fig. 1, the basic oscillator contains three pairs of electronic tubes; clamp triodes 11 and 12, amplifier triodes 13 and 14 and slaved multivibrator triodes 16 and 17. The remaining triodes, 18 and 19, comprise a direct-coupled output amplifier which insures the rectangularity of the output waveforms but is not an essential part of the basic oscillator.

The anodes 21 and 22 of the clamp tubes 11 and 12 are connected through a diode 23 and resistor 24, and a diode 26 and resistor 27, respectively, to a source of positive potential E at conductor 28. The respective junctions 29 and 31 between diode and resistor are coupled to ground through capacitors 32 and 33. The resistor 24 and capacitor 32 constitute a timing circuit and resistor 27 and capacitor 33 constitute a second timing circuit. The two timing circuits are usually alike. Diode 23 is biased by potential secured from a voltage divider consisting of resistors 34 and 36 connected in series, resistor 34 being grounded and resistor 36 being connected to a positive potential supply terminal 37. Similarly, diode 26 is biased by the voltage secured from a voltage divider consisting of resistors 38 and 39 connected in series. Resistor 38 is grounded and resistor 39 is connected to the positive terminal 37. Cathodes 41 and 42 are connected through respective by-passed resistors 43 and 44 to a power supply terminal 46 which is negative relative to ground. The control grids 47 and 48 of triodes 11 and 12 respectively are biased by being connected through resistors 49 and 51 to an intermediate terminal of a voltage divider consisting of series resistors 52 and 53 connected between ground and the negative terminal 46.

The potentials of junctions 29 and 31 are prevented from dropping below ground or zero potential by a limit circuit consisting of diodes 54, 56 and 57 and resistor 58 connected to positive terminal 37. This resistor 58 together with series grounded diode 57 maintains junction 59 at a potential close to +½ volt. When junction 29 is higher than this, diode 54 is nonconductive but if the potential of junction 29 drops materially below +½ volt, diode 54 begins to become conductive. Considering the potential drop through diode 54, the junction 29 is held very close to ground potential as its lower limit of voltage excursion. Diode 56 has a similar function in controlling the limit of potential of junction 31.

A bleeder resistance chain is connected between the positive terminal 37 and ground. This chain consists of voltage divider 61, resistor 62, voltage divider 63 and resistor 64, all connected in series. An adjustable voltage E is obtained from the slider 66 of the voltage divider 61 and applied to the conductor 28. Slider 66 constitutes the means for controlling the oscillator frequency and mechanical adjustment of this slider by external means is indicated by the dashed line 67. Voltage divider 63 produces an adjustable voltage V at its slider 68. A fixed resistor 69 is connected between the positive potential supply terminal 37 and the junction 71 between voltage divider 63 and resistor 64. This resistor 69 improves the linearity of frequency control.

The diodes 72 and 73 and resistor 74 constitute an upper limit circuit of a special kind for the potential of junction 29. Diode 73 and resistor 74 are connected in series between ground and conductor 76, which is connected to slider 68 and hence is at the potential V. Diode 72 is connected between junction 29 and junction 77. Thus the junction 77 is normally maintained at a potential about ½ volt below the potential V. However, this special limit circuit maintains the potential of junction 77 at $V-½$ only so long as junction 29 is lower than this potential and thus keeps diode 72 nonconductive. But upon increase of potential of the junction 29 above that of junction 77 diode 72 becomes conductive and upon further increase diode 73 becomes nonconductive, permitting junction 77 to rise with the potential of junction 29. A conductor 78 connected to junction 77 thus is conductively connected through diode 72 to junction 29 and shares its potential, but only above $V-½$ volts. This circuit thus behaves somewhat like a switch in conductor 78 which holds the potential of conductor 78 either at $V-½$ or at that of junction 29, whichever is higher.

A similar circuit consisting of diodes 79 and 81 and resistor 82 is similarly connected to junction 31 and conductor 83 and operates similarly.

The amplifier tubes 13 and 14 both amplify and invert the signals applied to them. Cathodes 84 and 86 are grounded through bypassed resistors 87 and 88, respectively. Their control grids 89 and 91 are connected to conductors 83 and 78, respectively. Anodes 92 and 93 are coupled through capacitors 94 and 96 to the control grids 47 and 48 of clamp tubes 11 and 12, respectively. These anodes 92 and 93 are also connected to the positive power terminal 37 through resistors 97 and 98. The component magnitudes and parameters of this amplifier are such as to provide class A operation.

In place of the triodes 13 and 14 employed as class A amplifier-inverters any other form of class A amplifier-inverter may be used. For example, pentodes may be employed in place of the triodes, or each tube may be replaced by an odd number of tubes in cascade.

Triodes 16 and 17 of the slaved multivibrator have a common grounded cathode resistor 99. Their anodes 101 and 102 are connected to load resistors 97 and 98, respectively. The control grids 103 and 104 are biased through resistors 106 and 107 connected to the midpoint of a voltage divider consisting of resistors 108 and 109 in series. Resistor 108 is connected to positive terminal 37 and resistor 109 is grounded. This pair of tubes operates as a slaved free-running multivibrator because its circuit components are so selected that its frequency of free oscillation is much lower than the lower end of the frequency range of the basic oscillator. The function of this slaved multivibrator is to shape the output waveforms and amplify their power and voltage. This slaved multivibrator has the additional function of emitting rectangular negative pulses which lock the clamp tubes in the nonconductive condition, as will be explained. This slaved multivibrator also insures the starting of the basic oscillator when power is first turned on. It does this by generating and applying steep front waveforms to the clamp tubes which upset any mutually locked-down condition into which it may be possible for the clamp tubes to fall when power is first applied to them.

Outputs are taken from the control grids 103 and 104 rather than from the anodes because the grid potential ranges are convenient in the depicted embodiment. Anodes 101 and 102 are cross-coupled to control grids 103 and 104 by capacitors 111 and 112.

Triodes 18 and 19 comprise a conventional direct-coupled amplifier having a common cathode resistor 113 returned to the negative terminal 46. Anode load resistors 114 and 116 are connected to the positive terminal 37. Outputs of opposite phase are taken from the two anode conductors 117 and 118. Inputs to the two control grids 119 and 121 are secured directly from the control grids 104 and 103 of the slaved multivibrator tubes 16 and 17.

The difficult problem of overcoming temperature effects on output frequency is solved by placing all components affecting the frequency temperature coefficient in an oven. This oven should be maintained at a temperature no lower than the highest ambient temperature to be experienced. Such an oven is indicated schematically by the dashed rectangle 122, indicating that all circuit components and parts within this rectangle may be kept in the constant-temperature oven. However, only those components asterisked must be held at constant temperature to attain oscillator accuracy. These components are the nine diodes 73, 72, 23, 54, 57, 56, 26, 79 and 81; the two capacitors 32 and 33; and the two resistors 24 and 27. No electronic tube need be put in the oven since no tube temperature characteristics affect the frequency of oscillation.

Reasonable potentials relative to ground, for example, are: terminal 37, +150 volts; terminal 46, −150 volts; slider 66 set to provide a potential E of +125 volts; slider 68 set to provide a potential V of +20 volts.

Figure 2:
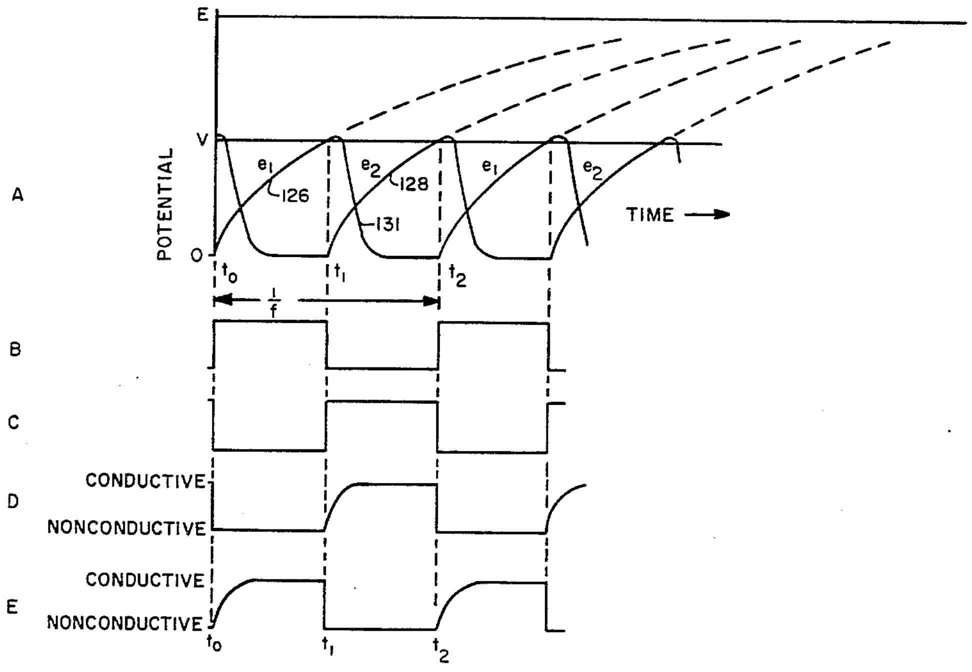
Figure 2 is a series of graphs used in explaining the operation of the invention.

The graph A of Fig. 2 represents the variations with time of the potential $e_1$ of junction 29 and of the potential $e_2$ of junction 31. The asymptotic potential E of slider 66 and the potential V of slider 68 are shown as horizontal lines.

At the time $t_0$, or an instant thereafter, clamp tube 11 is substantially nonconductive with its grid 47 held at a low potential. The ungrounded side of capacitor 32 is at or near ground zero potential and diode 23 is nonconductive. Clamp tube 12 is highly conductive, its grid is positive relative to the cathode and its anode current flow through diode 26 is high and increasing. The grid 89 of amplifier triode 13 is at about potential V. The potential of junction 77 and of grid 91 of amplifier triode 14 is at about ½ volt below potential V. Triode 16 of the slaved multivibrator is conductive and triode 17 is nonconductive. Output conductor 123 is at the upper output potential and conductor 124 is down, at the lower output potential.

It is necessary that at this time the junction 29 potential $e_1$ be accurately at zero potential, because the potential of this point at this time is the potential from which the exponential curve 126, Fig. 2A, starts. It may easily be shown that if this starting potential should be other than zero, the exponential function value at the time $t_1$ $$V = E\left(1-\epsilon^{\frac{-t_1}{RC}}\right) \quad (1)$$

would not be correct. Although the error would be but a small fraction of 1%, the accuracy demanded of this circuit requires this refinement. In this equation R is the effective resistance of resistor 24 and C is the capacitance of capacitor 32.

The potential $e_1$ has been brought, during current flow through tube 11 just prior to time $t_0$, to a potential closely approximating ground zero. During this current flow capacitor 32 was rapidly discharged. Resistor 58 and the voltage drop through diode 57 maintained junction 59 at +½ volt, $e_1$ fell below +½ volt, the diode 54 became conductive, and its potential drop of ½ volt caused the potential $e_1$ to assume the value of ground zero. The characteristic of diode 54 is such that it prevents $e_1$ from dropping materially below this value.

During the time that junction 29 was falling toward zero, prior to time $t_0$, because of the heavy current drawn through it by triode 11, diode 23 was conductive. Diode 72 became nonconductive when junction 29 potential fell below that of junction 77.

In operation, commencing at time $t_0$, grid 47 of tube 11 becomes highly negative and tube 11 becomes nonconductive as shown in graph D, Fig. 2. Consequently capacitor 32 commences charging through resistor 24 toward its asymptotic voltage E. This is indicated by the curved rise 126, graph A. During this time the diode 23 is made nonconductive by the action of high resistance voltage divider 34/36 which, in the absence of current flow through the tube 11, applies a positive potential of more than V inversely to diode 23. Thus during the exponential rise of junction 29 the capacitor 32 is isolated, at least between the approximate values of O and V, since diodes 72, 54 and 23 are all nonconductive. This has been found necessary to isolate the timing circuit during this time, particularly from distributed circuit wiring capacitances and from the capacitance of tube 11.

At about $e_1$=+20 volts, at time $t_1$, diode 72 becomes conductive and soon thereafter diode 73 becomes nonconductive. This in effect connects junction 29 to conductor 78 and grid 91 and disconnects the latter from slider 68 and potential V. As $e_1$ continues to rise the potential of grid 91 rises, which produces a greatly amplified fall of potential of anode 93. This is coupled through capacitor 96 to the grid 48 of clamp triode 12.

which stops the anode current of this triode. The fall of potential of anode 93 is also communicated through conductor 127 to the slaved multivibrator and through capacitor 112 reduces the potential of grid 103. This causes the multivibrator to switch, tube 17 becoming conductive and tube 16 nonconductive. This further lowers the potential of grid 48 of tube 12 and holds grid 48 negative and tube 12 nonconductive for the time $t_1$, $t_2$ as shown in graph E. As soon as grid 48 becomes highly negative and the current flow through tube 12 is cut off, the timing capacitor 33 commences charging as indicated by the branch 128, graph A. At the same time the increase of potential of the slaved multivibrator anode 101 is communicated through conductor 129 and coupling capacitor 94 to grid 47, causing tube 11 to begin to conduct. This terminates the charging cycle of the timing circuit 24/32 and $e_1$ starts to decrease as shown by the branch 131, graph A. At time $t_2$ a negative pulse from the amplifier anode 92 to grid 47 of tube 11 terminates the current flow of the latter and terminates the cycle. At this instant of termination the next cycle commences with the start of the $e_1$ potential rise as capacitor 32 again starts to charge through resistor 24.

The frequency of this oscillator is unaffected by variations of the supply voltage at terminal 37. If Equation 1 be solved for $t_1$ there results $$t_1 = RC \log\left(\frac{E}{E-V}\right) \qquad (2)$$

It is apparent that if E and V are each proportional to the supply potential, as they are, the latter cancels out and $t_1$ is independent of it. The frequency, being inversely proportional to $t_1$, is thus also independent of the supply potential. It follows that the frequency and the linearity thereof with adjustments of the shaft 67 are independent of the amounts of fixed voltage divider loading due to resistors 24 and 27. These loadings effectively merely change the supply potential and this does not affect frequency, as shown above. Equation 2 also shows that the period is linearly proportional to the product of R and C and therefore that frequency is proportional to $$\frac{1}{RC}$$

This emphasizes the importance of preserving the capacitor against any possible additions of capacitance while it is being charged, as has been described relative to diodes 72, 23 and 54.

One of the valuable properties of this circuit is the good linearity of frequency with adjustment of the shaft 67. That is to say, assuming the use of a linear voltage divider 61, that the frequency $f$ is highest at the highest value of E and its corresponding shaft position and is reduced in an approximately linear manner by changing the position of shaft 67 and reducing E accordingly.

This statement is true for any values of the components, but a further approach to exact linearity, employing a linear voltage divider, resulting in an error of but a small part of 1%, can be effected by a selective design of the bleeder resistances. Equation 2 may be converted to an infinite series form in frequency, $f$:

$$4RCf = \frac{x}{1 + \frac{1}{3x2} + \frac{1}{5x4} + \cdots} \qquad (3)$$

in which $$x = \frac{2E}{V} - 1 \qquad (4)$$

Analysis of this equation shows that the value of the fraction is nearly linear with $x$ over a selected range of $x$. By selecting resistors 62, 64 and 69 and by selecting the ranges of potentiometers 61 and 63 this desired range of $x$ can be selected. Then variation of the slider shaft 67 secures an almost linear variation of the frequency $f$ over the range of the potentiometer 61.

To summarize, the starting potential of each exponential rise, Fig. 2A, is determined by potential drops through diodes 54, 56 and 57 and is held exceedingly close to a datum potential shown as ground potential in Fig. 1. The termination of each exponential rise is at a voltage $V-\frac{1}{2}$ determined by a resistor adjustment and diodes 72, 73, 79 and 81. The rate of each exponential rise, assuming both RC combinations predetermined and fixed, is determined by the potential E which is in turn determined by the adjustment of the shaft of voltage divider 61. The half period $t_1 - t_0$, and consequently the frequency, is determined by all three of these factors, and by nothing else. Accuracy of RC operation is enhanced by isolating the RC circuit during the exponential voltage rise by diodes 54, 72, 23, 56, 79 and 26. Independence of temperature is secured by placing all components affecting frequency in an oven. Linearity of frequency adjustment is inherent and is made nearly perfect by choice of components.

What is claimed is:

1. An adjustable oscillator comprising, a pair of timing circuits each of which comprises a resistor and capacitor connected in series between a grounded adjustable source of potential and ground, clamp tube means connected in shunt with each of said capacitors, whereby the rendering of said clamp tube means conductive discharges the capacitor, semi-conductor diode means limiting maximum and minimum potentials of said capacitors on charge and discharge respectively, a slaved free-running multivibrator having a frequency of free-running oscillation lower than the range of frequency of said oscillator, means slaving said multivibrator to said pair of timing circuits whereby the multivibrator frequency is that of the alternating charging cycle of the pair of timing circuits, semi-conductor diode means isolating each of said capacitors during the greater part of the charging cycle thereof, a pair of inverter amplifiers respectively connected between said pair of timing circuits and said slaved multivibrator, means clamping each clamp tube means operated from said associated timing circuit at the maximum charge of the capacitance thereof and unclamping operated from the other timing circuit at the minimum charge of the capacitance thereof, and a constant-temperature oven enclosing said semi-conductor means and said timing circircuits whereby said oscillator frequency is unaffected by ambient temperature changes.

2. An oscillator comprising, first and second clamp tubes each having an anode, cathode and control grid, a pair of timing circuits each of which comprises a resistor and capacitor connected in series across a source of potential, the intermediate terminals of the respective timing circuits being connected to the anodes of respective ones of said clamp tubes whereby the capacitor of a respective timing circuit is discharged during the conductive state of a respective clamp tube and charged during the nonconductive state thereof, means for precisely determining the potential of said capacitors in their discharged condition, a pair of inverter amplifiers each having a respective input thereof connected to have impressed thereon the potential developed across a respective timing circuit capacitor, means for precisely determining the lower limit of potential applied to the inputs of said inverter amplifiers when their associated timing circuit capacitors are in discharge condition, a free-running multivibrator having a pair of inputs respectively connected to the respective outputs of said inverter amplifier, and a pair of outputs for said multivibrator connected to the grids of said clamp tubes whereby said clamp tubes are alternately switched between the conductive and non-conductive states.

3. An oscillator comprising, a grounded source of potential having first and second potentiometers connected in series thereacross, said first potentiometer having a shaft and a first slider potential $E_1$ and said second potentiometer having a second slider potential $E_2$, first and second clamp tubes each having an anode, cathode and control grid, a pair of timing circuits each of which comprises a resistor and capacitor connected in series between said first slider and ground, the intermediate terminals of the respective timing circuits being connected to the anodes of respective ones of said clamp tubes whereby the capacitor of a respective timing circuit is discharged during the conductive state of a respective clamp tube and charged during the nonconductive state thereof, whereby the frequency of said oscillator is determined by the alternate charging times of said timing circuits in linear relation to a function of $E_1/E_2$ and to the position of said shaft, means for precisely limiting the potentials of said capacitors in their discharged condition to ground potential, means for precisely limiting the maximum charge potentials of said capacitors, a pair of inverter amplifiers each having a load resistor and each amplifier having the potentials across a respective timing capacitor impressed on the input thereof, said maximum charge limiting means also precisely limiting the lowest potentials which may be applied to said inverter amplifier inputs, a free-running slaved multivibrator having load resistors in common with said pair of inverter amplifiers, said multivibrator having a pair of inputs connected to the respective outputs of said inverter amplifiers, and a pair of outputs for said multivibrator coupled to the grids of said clamp tubes whereby said clamp tubes are each switched on and switched off by the increase of potential of a timing capacitor and whereby each said clamp tube is held nonconductive by said slaved multivibrator.

4. An oscillator in accordance with claim 3 including a constant-temperature oven enclosing said semi-conductor diodes and said timing circuit resistors and capacitors.

5. An oscillator comprising, a grounded source of potential having first and second potentiometers connected in series thereacross, said first potentiometer having a shaft and a first slider potential $E_1$ and said second potentiometer having a second slider potential $E_2$, first and second clamp tubes each having an anode, cathode and control grid, a pair of timing circuits each of which comprises a resistor and capacitor connected in series between said first slider and ground, the intermediate terminals of the respective timing circuits being connected through semi-conductor diodes to the anodes of respective ones of said clamp tubes whereby the capacitor of a respective timing circuit is discharged during the conductive state of a respective clamp tube and charged during the non-conductive state thereof, whereby the frequency of said oscillator is determined by the alternate charging times of said timing circuit in linear relation to a function of $E_1/E_2$ and to the position of said shaft, semi-conductor diode means for precisely limiting the potentials of said capacitors in their discharged conditions to ground potential, semi-conductor diode means for precisely limiting the maximum charge potentials of said capacitors, a pair of inverter amplifiers each having a load resistor and each amplifier having the potentials across a respective timing capacitor impressed on the input thereof, said maximum charge limiting means also precisely limiting the lowest potentials which may be applied to said inverter amplifier inputs, a free-running slaved multivibrator having load resistors in common with said pair of inverter amplifiers, said multivibrator having a pair of inputs connected to the respective outputs of said inverter amplifiers, and a pair of outputs for said multivibrator coupled to the grids of said clamp tubes whereby said clamp tubes are each switched on and switched off by the increase of potential of a timing capacitor and whereby each said clamp tube is held non-conductive by said slaved multivibrator.

6. An oscillator in accordance with claim 5 including a constant-temperature oven enclosing said semi-conductor diodes and said timing circuit resistors and capacitors.

7. An oscillator comprising, a source of potential having first and second potentiometers connected in series thereacross, a pair of timing circuits each consisting of a resistor and a capacitor connected in series between the low potential terminal of said source and the slider of said first potentiometer, a pair of potential limiting circuits each comprising a crystal diode and resistor connected in series between the slider of said second potentiometer and the low potential terminal of said source, a third potential limiting circuit comprising a resistor and crystal diode connected in series across said source, a first pair of diodes connected in series between the common junction of the diode and resistor of said third potential limiting circuit and the common junction of one of said first-mentioned pair of potential limiting circuits, a second pair of diodes connected in series between the common junction of the diode and resistor of said third potential limiting circuit and the common junction of the other of said first-mentioned pair of potential limiting circuits, the common junction of said first pair of diodes being connected to the common junction of the resistor and capacitor of one of said timing circuits and the common junction of said second pair of diodes being connected to the common junction of the resistor and capacitor of the other of said timing circuits, a first clamp tube having its anode connected through a diode to the common capacitor-resistor junction of said one timing circuit, the anode of said first clamp tube being connected to an intermediate terminal of a high resistance potential divider connected across said source, a second clamp tube having its anode connected through a diode to the common capacitor-resistor junction of said other timing circuit, the anode of said second clamp tube being connected to an intermediate terminal of a second high resistance potential divider connected across said source, a first inverter amplifier having its input connected to the common junction of said one of said first-mentioned pair of potential limiting circuits, a second inverter amplifier having its input connected to the common junction of said other of said first-mentioned pair of potential limiting circuits, a free-running multivibrator having a pair of inputs respectively connected to the respective outputs of said first and second inverter amplifiers, and a pair of outputs for said multivibrator respectively connected to the grids of said first and second clamp tubes.

No references cited.